(12) United States Patent
Sugiura

(10) Patent No.: US 6,897,076 B2
(45) Date of Patent: May 24, 2005

(54) LITHOGRAPHY SYSTEM, EXPOSURE APPARATUS AND THEIR CONTROL METHOD, AND DEVICE MANUFACTURING METHOD

(75) Inventor: Satoshi Sugiura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 93 days.

(21) Appl. No.: 10/281,180

(22) Filed: Oct. 28, 2002

(65) Prior Publication Data

US 2003/0084808 A1 May 8, 2003

(30) Foreign Application Priority Data

Nov. 2, 2001 (JP) ........................................ 2001-338332

(51) Int. Cl.$^7$ .............................................. H01L 21/66
(52) U.S. Cl. ........................................... 438/14; 438/15
(58) Field of Search ...................................... 438/14, 15

(56) References Cited

U.S. PATENT DOCUMENTS

| | | | | |
|---|---|---|---|---|
| 5,930,138 A | * | 7/1999 | Lin et al. ...................... | 700/108 |
| 6,320,195 B1 | * | 11/2001 | Magome ................. | 250/442.11 |
| 6,406,820 B1 | * | 6/2002 | Ota .............................. | 430/30 |
| 6,597,002 B1 | * | 7/2003 | Kondo ..................... | 250/492.2 |
| 6,641,981 B1 | * | 11/2003 | Kaneko et al. ............. | 430/311 |
| 6,654,095 B1 | * | 11/2003 | Nishi .......................... | 355/30 |
| 6,673,638 B1 | * | 1/2004 | Bendik et al. ................ | 438/14 |
| 6,698,944 B2 | * | 3/2004 | Fujita ......................... | 396/611 |
| 6,699,630 B2 | * | 3/2004 | Ota .............................. | 430/30 |
| 6,709,878 B2 | * | 3/2004 | Akram et al. ................. | 438/14 |
| 6,727,981 B2 | * | 4/2004 | Taniuchi et al. .............. | 355/55 |

FOREIGN PATENT DOCUMENTS

JP 2877998 1/1999

* cited by examiner

Primary Examiner—John F. Niebling
Assistant Examiner—Olivia T. Luk
(74) Attorney, Agent, or Firm—Fitzpatrick, Cella, Harper & Scinto

(57) ABSTRACT

A lithography system includes a pre-process apparatus which performs a pre-process for a substrate and an exposure apparatus which exposes the substrate pre-processed by the pre-process apparatus to a pattern. The pre-process apparatus includes a first control unit which transmits an instruction for starting exposure preparation to the exposure apparatus, and the exposure apparatus includes a second control unit which causes exposure preparation to start in accordance with the instruction transmitted from the pre-process apparatus.

15 Claims, 7 Drawing Sheets

FIG. 2
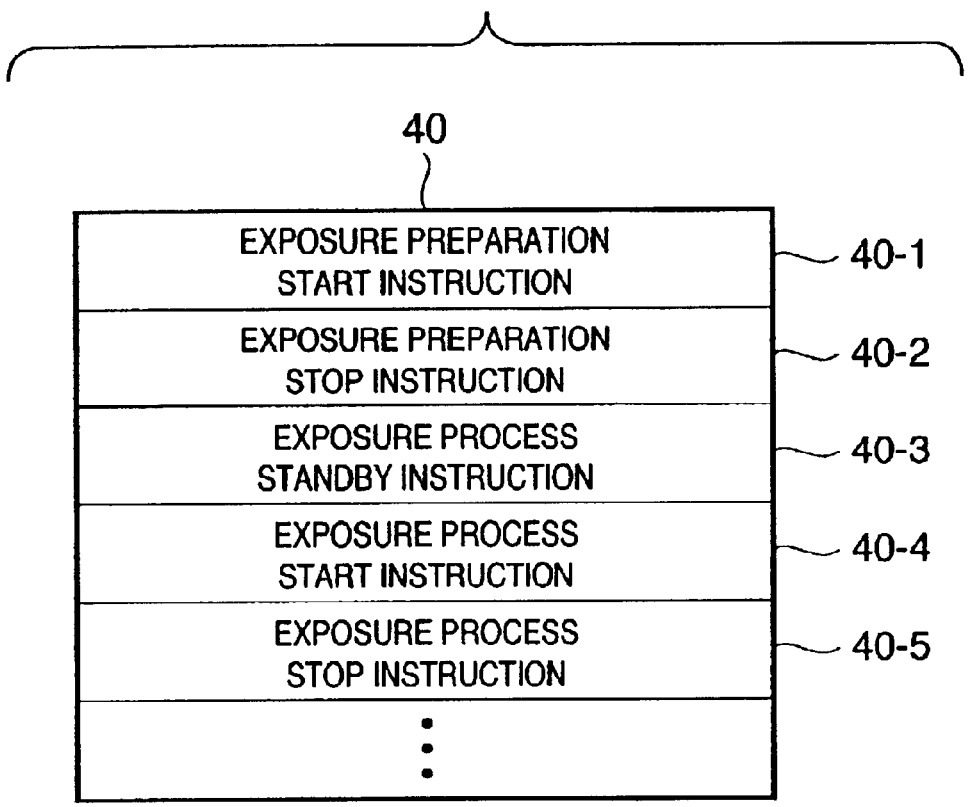
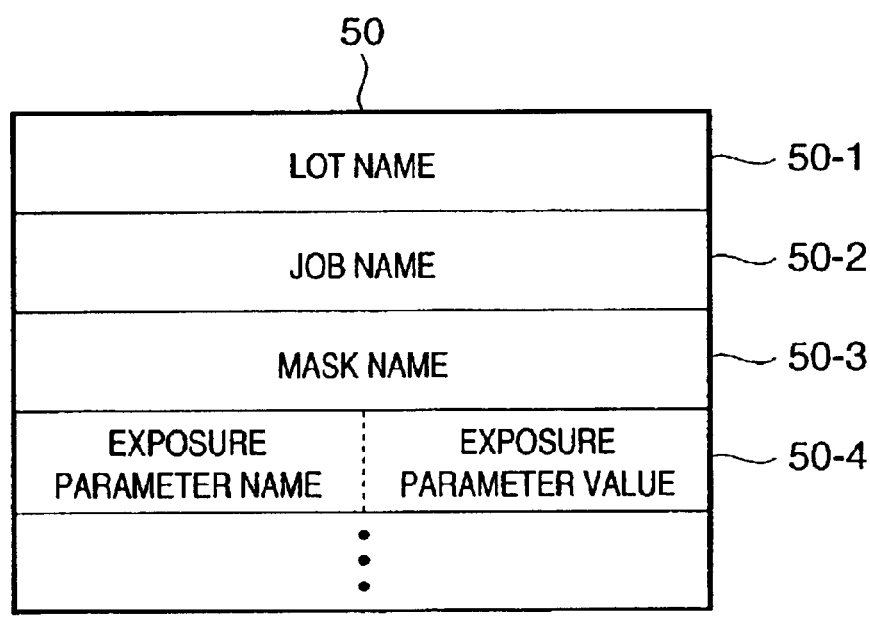

LITHOGRAPHY SYSTEM, EXPOSURE APPARATUS AND THEIR CONTROL METHOD, AND DEVICE MANUFACTURING METHOD

FIELD OF THE INVENTION

The present invention relates to a lithography system, an exposure apparatus, and their control method, and a device manufacturing method and, more particularly, to a lithography system including a pre-process apparatus which performs a predetermined process for a substrate before exposure and an exposure apparatus which exposes the substrate processed by the pre-process apparatus and transfers a pattern to the substrate, an exposure apparatus in the system and their control method, and a semiconductor device manufacturing method in the system.

BACKGROUND OF THE INVENTION

In a conventional exposure apparatus, when exposure processing is to be performed while directly connecting (in-line) the exposure apparatus to a substrate pre-process apparatus (e.g., a resist coating apparatus) and a substrate post-process apparatus (e.g., a development apparatus), the apparatuses are connected to each other through communication lines, and control signals for loading and unloading a substrate are exchanged using the communication lines. In Japanese Patent No. 2,877,998, a control signal for wafer transfer and a wafer process condition information signal are transmitted to an exposure apparatus using such communication lines, thereby improving the efficiency of communication with a host computer, and the like.

However, in a conventional exposure apparatus disclosed in Japanese Patent Publication No. 2,877,998, a control signal which controls loading and unloading of a substrate and exposure process conditions are only transmitted from a pre-process apparatus to the exposure apparatus. For this reason, a host computer or the user must directly issue control instructions that pertain to exposure processing operation such as an exposure preparation start instruction, an exposure preparation stop instruction, an exposure process standby instruction, an exposure process start instruction, an exposure process stop instruction, and the like, to an exposure apparatus.

SUMMARY OF THE INVENTION

The present invention has been made in consideration of the above background, and has as its object to provide, e.g., a lithography system capable of reducing the load on the user in exposure processing, an exposure apparatus, and their control method, and a device manufacturing method.

According to the first aspect of the present invention, there is provided a lithography system characterized by comprising a pre-process apparatus which performs a predetermined process for a substrate before exposure and an exposure apparatus which exposes the substrate processed by the pre-process apparatus to a pattern, wherein the pre-process apparatus includes transmitting means for transmitting an exposure control instruction for controlling exposure processing in the exposure apparatus to the exposure apparatus, and the exposure apparatus includes control means for executing exposure processing for the substrate in accordance with the exposure control instruction transmitted from the pre-process apparatus by the transmitting means.

According to a preferred embodiment of the present invention, the exposure control instruction preferably includes at least one of an instruction for starting exposure preparation, an instruction for stopping exposure preparation, an instruction for making exposure processing stand by, an instruction for starting exposure processing, and an instruction for stopping exposure processing.

According to a preferred embodiment of the present invention, the exposure apparatus preferably further includes means for enqueuing a plurality of exposure control instructions from the pre-process apparatus and performing exposure processing while executing the plurality of enqueued exposure control instructions in turn.

According to a preferred embodiment of the present invention, the exposure apparatus preferably further includes means for controlling a post-process apparatus which performs a predetermined process for a substrate after exposure.

According to a preferred embodiment of the present invention, the pre-process apparatus preferably includes a resist coating apparatus which coats the substrate with a resist.

According to a preferred embodiment of the present invention, the post-process apparatus preferably includes a development apparatus which performs development processing for the substrate after exposure.

According to the second aspect of the present invention, there is provided an exposure apparatus which has a function of communicating with a pre-process apparatus for performing a predetermined process for a substrate before exposure and exposes the substrate processed by the pre-process apparatus to a pattern, characterized by comprising control means for executing exposure processing for the substrate in accordance with an exposure control instruction transmitted from the pre-process apparatus.

According to a preferred embodiment of the present invention, the exposure control instruction preferably includes at least one of an instruction for starting exposure preparation, an instruction for stopping exposure preparation, an instruction for making exposure processing stand by, an instruction for starting exposure processing, and an instruction for stopping exposure processing.

According to a preferred embodiment of the present invention, the apparatus preferably further comprises means for enqueuing a plurality of exposure control instructions from the pre-process apparatus and performing exposure processing while executing the plurality of enqueued exposure control instructions in turn.

According to a preferred embodiment of the present invention, the apparatus preferably further comprises means for controlling a post-process apparatus which performs a predetermined process for a substrate after exposure.

According to a preferred embodiment of the present invention, the pre-process apparatus preferably includes a resist coating apparatus which coats a substrate with a resist.

According to a preferred embodiment of the present invention, the post-process apparatus preferably includes a development apparatus which performs development processing for a substrate after exposure.

According to the third aspect of the present invention, there is provided a method of controlling a lithography system comprising a pre-process apparatus which performs a predetermined process for a substrate before exposure and an exposure apparatus which exposes the substrate processed by the pre-process apparatus to a pattern, characterized by comprising the transmitting step of transmitting an exposure control instruction for controlling exposure processing in the exposure apparatus to the exposure apparatus, and the control step of executing exposure processing for the substrate in the exposure apparatus in accordance with the exposure control instruction transmitted from the pre-process apparatus.

According to the fourth aspect of the present invention, there is provided a method of controlling an exposure apparatus which has a function of communicating with a pre-process apparatus for performing a predetermined process for a substrate before exposure and exposes the substrate processed by the pre-process apparatus to a pattern, characterized by comprising the control step of executing exposure processing for the substrate in accordance with an exposure control instruction transmitted from the pre-process apparatus.

According to the fifth aspect of the present invention, there is provided a semiconductor device manufacturing method, characterized by comprising the coating step of applying a photosensitive agent to a substrate by a resist coating apparatus, the exposure step of transferring a pattern onto the substrate, to which the photosensitive agent is applied in the coating step, by an exposure apparatus whose exposure operation is controlled by the resist coating apparatus, and the development step of developing the photosensitive agent on the substrate, onto which the pattern is transferred in the exposure step, by a development apparatus.

According to a preferred embodiment of the present invention, in the development step, the development apparatus preferably executes development processing on the basis of control data supplied from the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a diagram showing the contents of an exposure control instruction and exposure conditions for exposure processing in an exposure apparatus according to the preferred embodiment of the present invention;

DETAILED DESCRIPTION OF THE PREFERRED EMBODIMENTS

A lithography system as a preferred embodiment of the present invention will be exemplified in detail below with reference to the accompanying drawings. Note that the specific contents described in this embodiment are merely intended to help understanding the present invention, and the scope of the present invention is not limited to these.

(One Embodiment)

A preferred embodiment of the present invention will be described in detail below with reference to the drawings.

Figure 1:
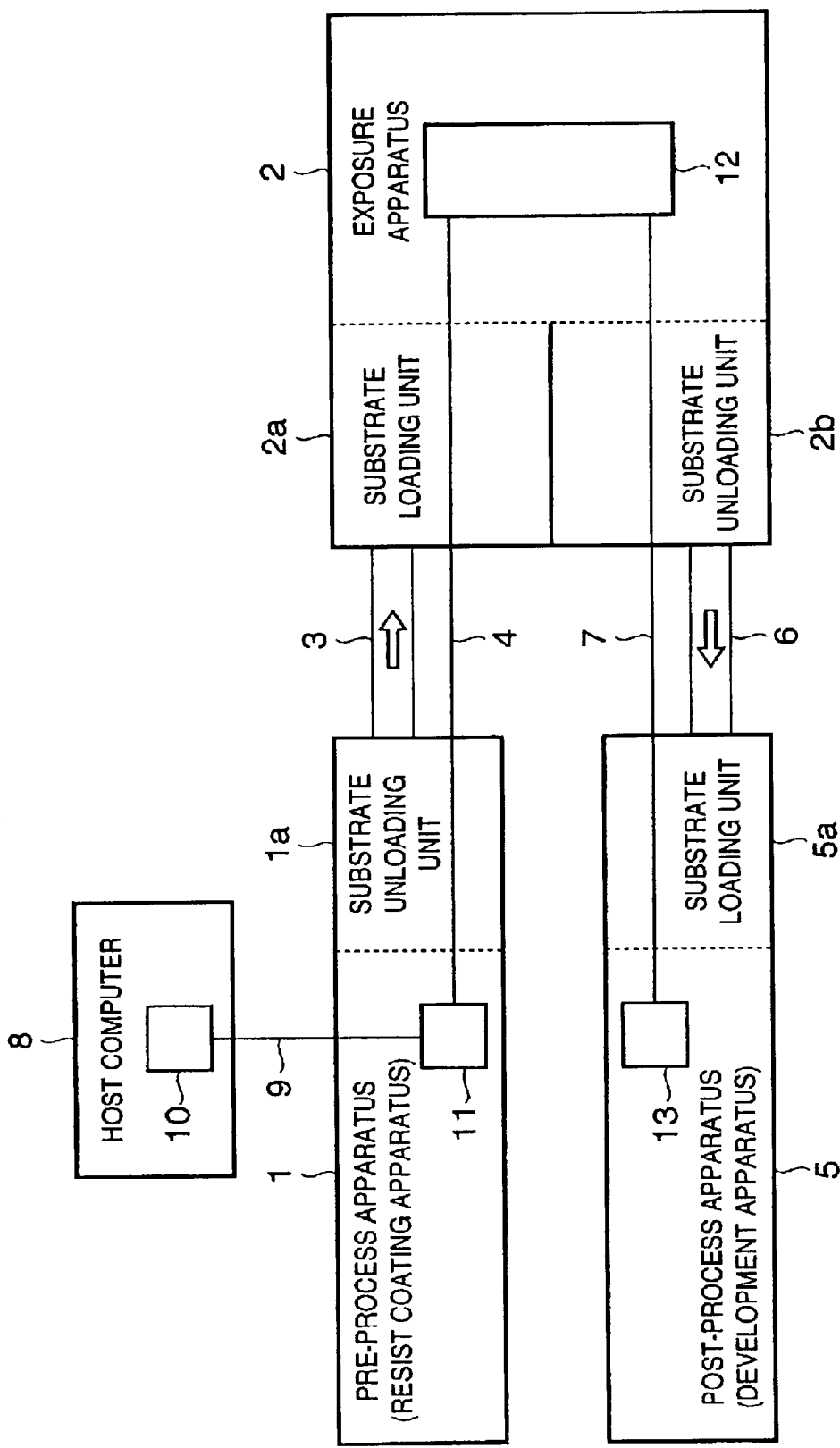
FIG. 1 is a block diagram showing the arrangement of a lithography system according to a preferred embodiment of the present invention.

FIG. 1 is a block diagram showing the arrangement of a lithography system according to the preferred embodiment of the present invention.

[Overall Arrangement]

As shown in FIG. 1, the lithography system according to the preferred embodiment of the present invention is comprised of, e.g., a host computer 8, a resist coating apparatus 1, an exposure apparatus 2, and a development apparatus 5. The resist coating apparatus 1 is an example of a pre-process apparatus which performs pre-processing before exposure; and the development apparatus 5, a post-process apparatus which performs post-processing after exposure.

The exposure apparatus 2 is an apparatus for transferring a pattern on a mask to a substrate coated with a resist and has a substrate loading unit 2a which receives a substrate transferred from the resist coating apparatus 1 by a substrate transfer mechanism 3, a substrate unloading unit 2b which passes the substrate having undergone exposure in the exposure apparatus 2 to a substrate transfer mechanism 6 so as to transfer it to the development apparatus 5, and a controller 12 which processes the substrate in accordance with an exposure control instruction 40 transmitted from the resist coating apparatus 1 through a communication line 4 and transmits control data used to execute development processing on the basis of the processing result to the development apparatus 5 to control the development apparatus 5.

The resist coating apparatus 1 is an apparatus for applying a photosensitive material to a substrate as pre-processing of exposure processing and has a substrate unloading unit 1a which passes the substrate to the substrate transfer mechanism 3 so as to transfer it to the exposure apparatus 2 and a controller 11 which executes various instructions issued from a controller 10 of the host computer 8, coats the substrate with a resist, and transmits the exposure control instruction 40 and exposure conditions 50 to the exposure apparatus 2.

The substrate transfer mechanism 3, which conveys a substrate unloaded from the substrate loading unit 1a into the substrate loading unit 2a of the exposure apparatus 2, is arranged between the exposure apparatus 2 and the resist coating apparatus 1. The controller 11 of the resist coating apparatus 1 is connected to the controller 12 of the exposure apparatus 2 through the communication line (based on a standard such as RS232C) 4 for transmitting the exposure control instruction 40 and exposure conditions 50 from the resist coating apparatus 1 to the exposure apparatus 2 and receiving status information, and the like, from the exposure apparatus 2 by the resist coating apparatus 1. The controllers 11 and 12 each have a function of controlling transfer of a substrate by the substrate transfer mechanism 3, unloading of the substrate by the substrate unloading unit 1a, loading of the substrate by the substrate loading unit 2a, and the like, while communicating with each other.

The development apparatus 5 is an apparatus for performing development processing for a substrate as post-processing of exposure processing and has a substrate loading unit 5a for loading the substrate transferred through the substrate transfer mechanism 6 into the development apparatus 5 and a controller 13 for performing development processing on the basis of control data transmitted from the exposure apparatus 2.

The substrate transfer mechanism 6, which conveys a substrate unloaded from the substrate unloading unit 2b of the exposure apparatus 2 into the substrate loading unit 5a of the development apparatus 5, is arranged between the exposure apparatus 2 and the development apparatus 5. The controller 12 of the exposure apparatus 2 is connected to the controller 13 of the development apparatus 5 through a communication line 7 for transmitting control data, which is generated on the basis of the exposure processing result of the exposure apparatus 2, from the exposure apparatus 2 to the development apparatus 5. The controllers 12 and 13 each have a function of controlling transfer of a substrate by the substrate unloading unit 2b, loading of the substrate by the substrate loading unit 5a, and the like, while communicating with each other.

The host computer 8 directly controls the resist coating apparatus 1 by transmitting the exposure control instruction 40 to the resist coating apparatus 1 and additionally controls the exposure apparatus 2 and development apparatus 5 through the resist coating apparatus 1. For this reason, the exposure apparatus 2 and development apparatus 5 can automatically be controlled only by transmitting the exposure control instruction 40 to the resist coating apparatus 1. This can reduce the load on the user in exposure processing. The host computer 8 includes the controller 10 which has a function of transmitting parameters to specify resist coating conditions and the exposure conditions 50 to the resist coating apparatus 1. The host computer 8 is connected to the controller 11 of the resist coating apparatus 1 through a communication line 9.

[Conditions and Instructions for Exposure Processing]

FIG. 2 is a diagram showing the contents of the exposure control instruction 40 and exposure conditions 50 for exposure processing in an exposure apparatus according to the preferred embodiment of the present invention.

Information sent from the resist coating apparatus 1 to exposure apparatus 2 includes the exposure control instruction 40 and exposure conditions 50, which are generated by the controller 11 in accordance with information supplied directly from the user or supplied from the host computer 8. The exposure control instruction 40 includes exposure process instructions that pertain to the operation of the exposure apparatus 2, such as an exposure preparation start instruction 40-1 for starting exposure preparation, an exposure preparation stop instruction 40-2 for stopping exposure preparation, an exposure process standby instruction 40-3 for making exposure processing stand by, an exposure process start instruction 40-4 for starting exposure processing, an exposure process stop instruction 40-5 for stopping exposure processing, and the like. The exposure conditions 50 include parameters necessary for exposure processing, and the like, such as a lot name 50-1, which represents the exposure process unit, a job name 50-2 of a parameter file used to hold a group of exposure parameters and to select one out of a plurality of jobs set in advance in, e.g., a magnetic disk of the exposure apparatus 2, a mask name 50-3 for use in exposure, and an exposure parameter name and an exposure parameter value 50-4 used to temporarily change the values of parameters defined in the job specified by the job name 50-2. The exposure control instruction 40 and exposure conditions 50 are sent to the exposure apparatus 2 through the communication line 4 connecting the resist coating apparatus 1 to the exposure apparatus 2.

[Flow Chart of Exposure Processing]

Figure 3A:
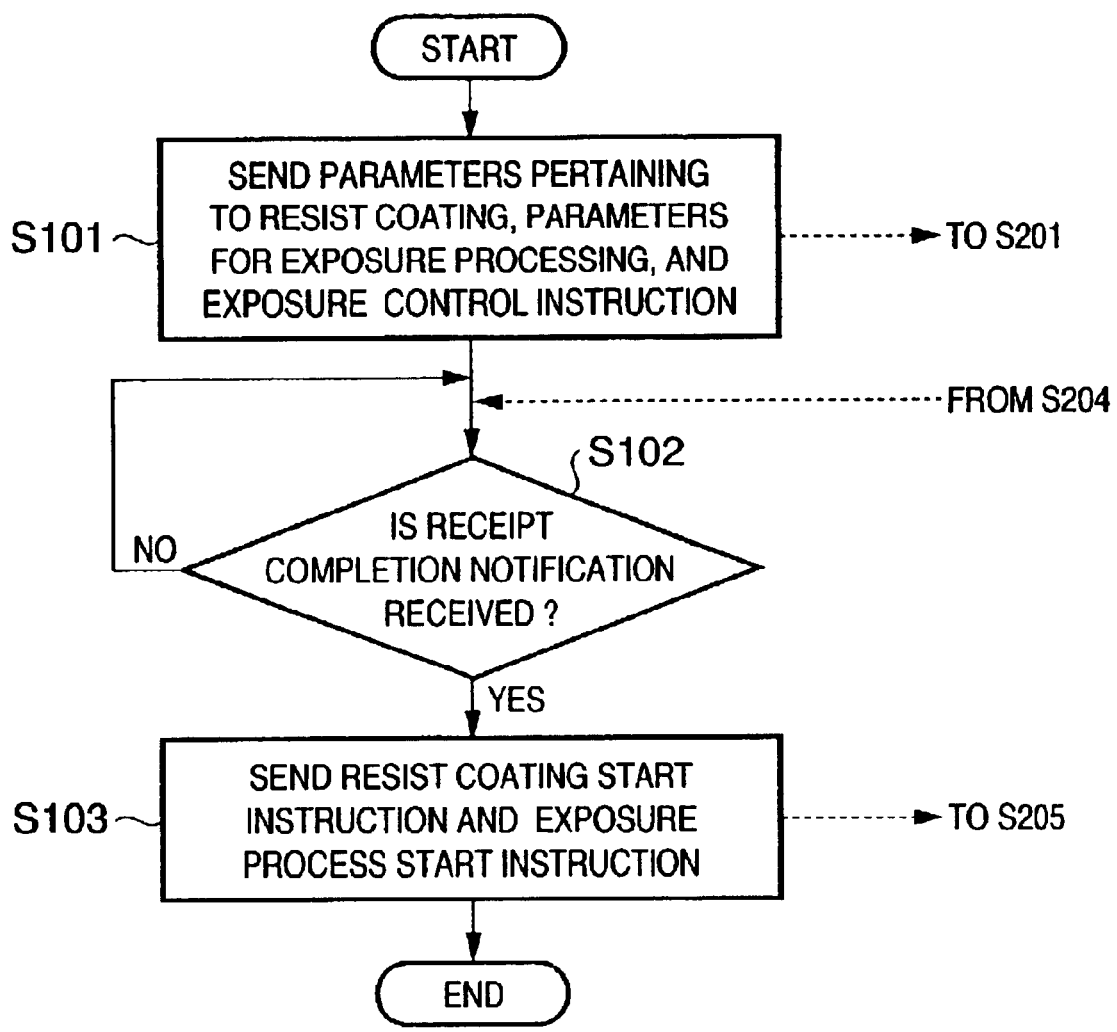
FIG. 3A is a flow chart showing the processing sequence in a host computer in the lithography system according to the preferred embodiment of the present invention.
Figure 3B:
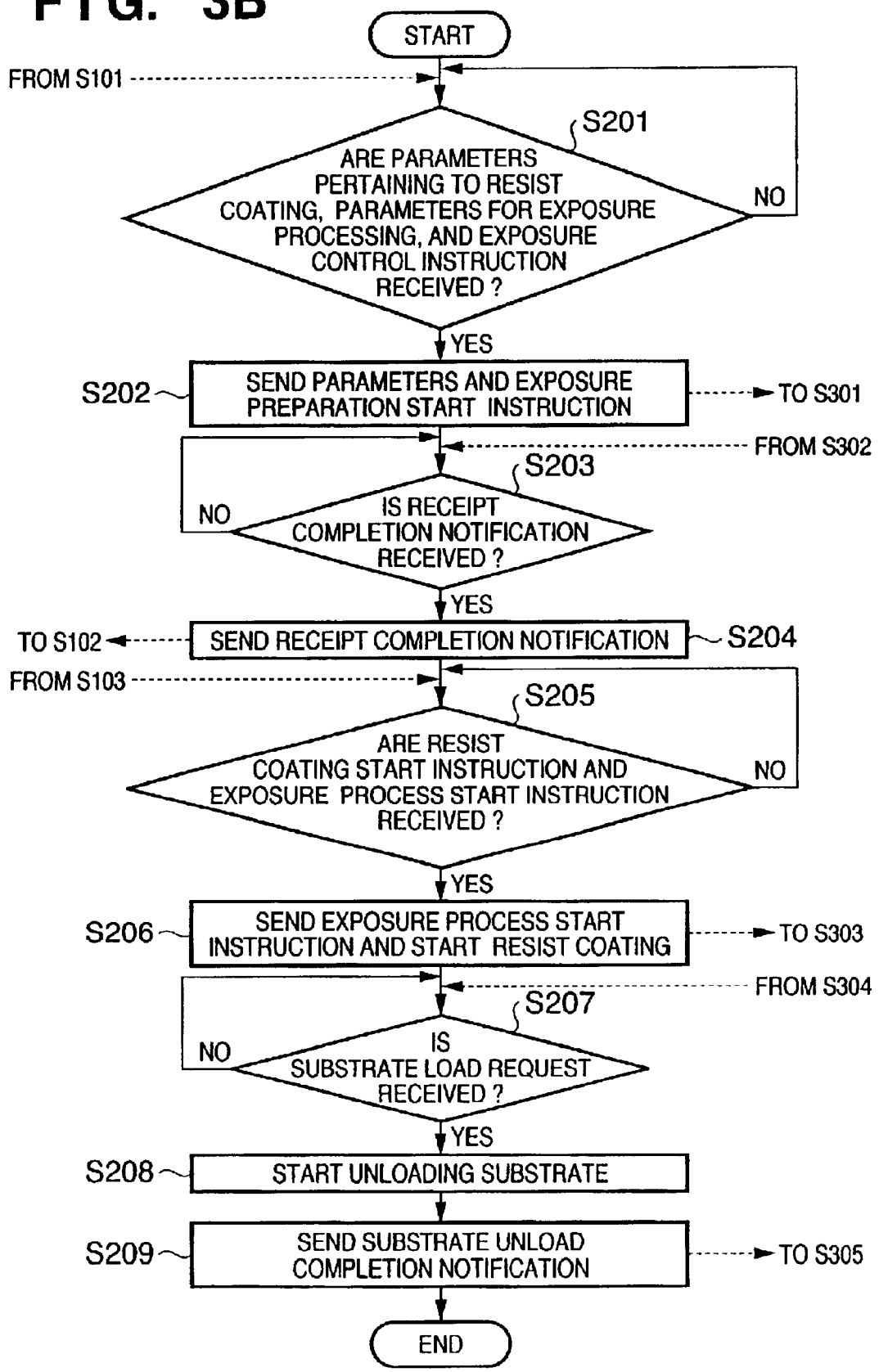
FIG. 3B is a flow chart showing the processing sequence in a resist coating apparatus in the lithography system according to the preferred embodiment of the present invention.
Figure 3C:
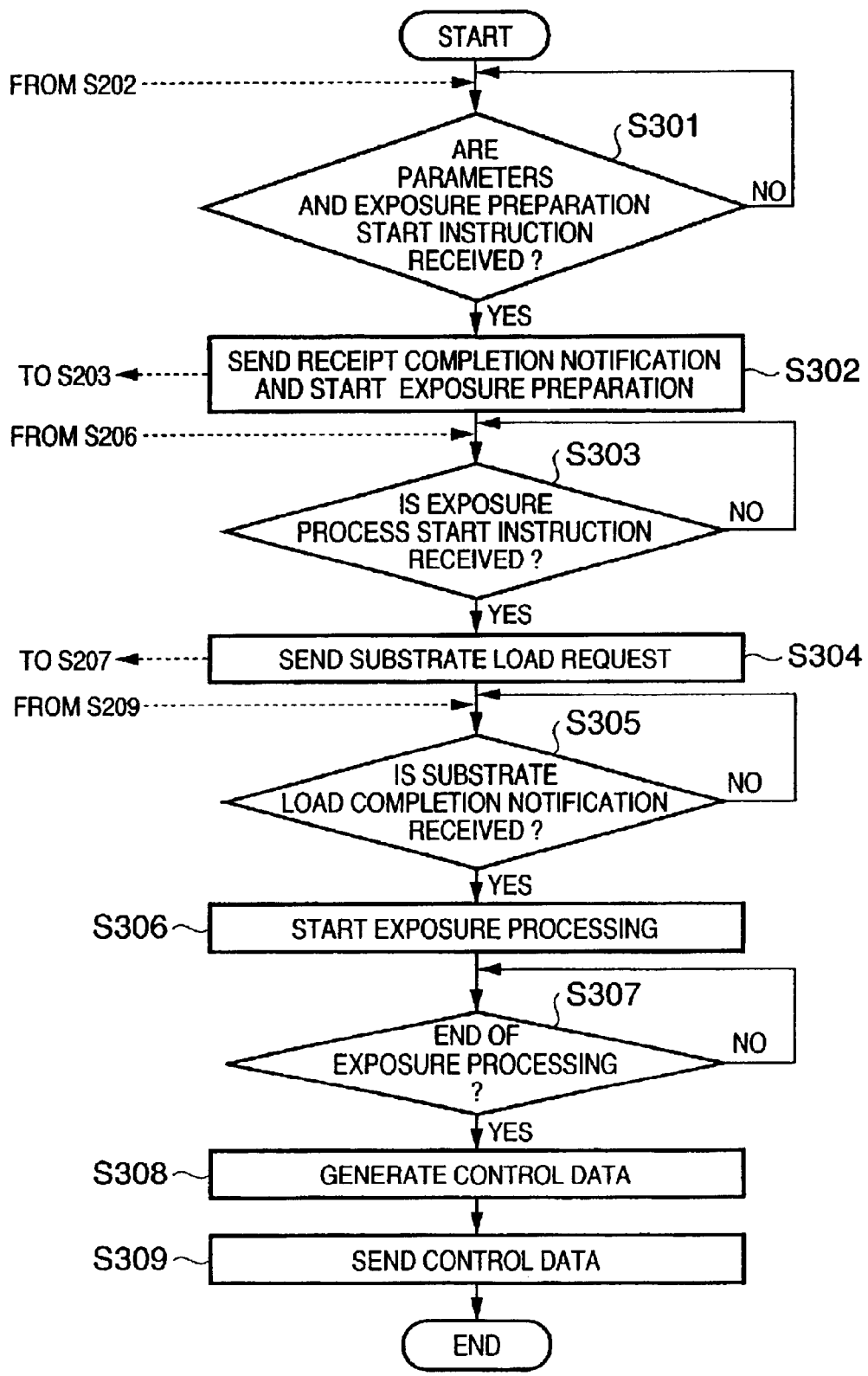
FIG. 3C is a flow chart showing the processing sequence of an exposure apparatus in the lithography system according to the preferred embodiment of the present invention.

FIGS. 3A to 3C are flow charts of the processing of the lithography system according to the preferred embodiment of the present invention.

Steps S101 to S103 in FIG. 3A represent the processing sequence in the host computer 8; steps S201 to S209 in FIG. 3B, the processing sequence in the resist coating apparatus 1; and steps S301 to S309 in FIG. 3C, the processing sequence in the exposure apparatus 2.

The processing sequence in the host computer 8 will be described mainly with reference to FIG. 3A.

The host computer 8 transmits parameters that pertain to resist coating, parameters for exposure processing (the exposure conditions 50), and the exposure control instruction 40 to the resist coating apparatus 1 (step S101).

In response to this, the resist coating apparatus 1 transmits a receipt completion notification indicating the receipt of these parameters and instructions to the host computer 8 (see step S204 in FIG. 3B).

Then, the host computer 8 determines whether it receives the receipt completion notification from the resist coating apparatus 1 (step S102). If the host computer 8 receives the parameter receipt completion notification (YES in step S102), it transmits a resist coating start instruction and the exposure process start instruction 40-4 to the resist coating apparatus 1 (step S103), and the sequence in the host computer 8 ends. If the host computer 8 does not receive the parameter receipt completion notification (NO in step S102), it stands by until it receives the parameter receipt completion notification (step S102).

As described above, the resist coating apparatus 1 and exposure apparatus 2 can be controlled only by sending a control instruction, and the like, to the resist coating apparatus 1.

Then, the processing sequence in the resist coating apparatus 1 will be described mainly with reference to FIG. 3B.

The resist coating apparatus 1 determines whether it receives the resist coating parameters, exposure conditions 50, exposure control instruction 40, and the like, which have been transmitted by the host computer 8 in step S101 of FIG. 3A (step S201). If the resist coating apparatus 1 receives the resist coating parameters, exposure conditions 50, exposure control instruction 40, and the like (YES in step S201), it extracts a required portion from these parameters and instructions, and transmits the portion together with the exposure preparation start instruction 40-1 to the exposure apparatus 2 (step S202). If the resist coating apparatus 1 does not receive the resist coating parameters, exposure conditions 50, exposure control instruction 40, and the like (NO, in step S201), it stands by until it receives the resist coating parameters, exposure conditions 50, exposure control instruction 40, and the like (step S201).

Upon receipt of the parameters and instructions, the exposure apparatus 2 transmits a receipt completion notification to the resist coating apparatus 1 (see step S302 in FIG. 3C). The resist coating apparatus 1 determines whether it receives the receipt completion notification from the exposure apparatus 2 (step S203). If the resist coating apparatus 1 receives the receipt completion notification (YES in step S203), it confirms the start of exposure preparation in the exposure apparatus 2 and then transmits a receipt completion notification to the host computer 8 (step S204). If the resist coating apparatus 1 does not receive the receipt completion notification (NO in step S203), it stands by until it receives the receipt completion notification (step S203).

Upon receipt of the receipt completion notification, the host computer 8 transmits a resist coating start instruction and the exposure process start instruction 40-4 to the resist coating apparatus 1 (see step S103 in FIG. 3A). The resist coating apparatus 1 determines whether it receives the resist coating start instruction and exposure process start instruction 40-4 from the host computer 8 (step S205). If the resist coating apparatus 1 receives the resist coating start instruction and exposure process start instruction 40-4 (YES in step S205), it transmits the exposure process start instruction 40-4 and at the same time starts resist coating (step S206). If the resist coating apparatus 1 does not receive the resist coating start instruction and exposure process start instruction 40-4 (NO in step S205), it stands by until it receives the resist coating start instruction and exposure process start instruction 40-4 (step S205).

On the other hand, when the exposure apparatus 2 receives the exposure process start instruction 40-4 and completes exposure preparation, it transmits a substrate load request to the resist coating apparatus 1 (see step S304 in FIG. 3C). The resist coating apparatus 1 determines whether it receives the substrate load request from the exposure apparatus 2 (step S207). If the resist coating apparatus 1 receives the substrate load request from the exposure apparatus 2 (YES in step S207), it transfers the substrate having undergone resist coating to the exposure apparatus 2 (step S208). More specifically, the resist coating apparatus 1 passes the substrate to the substrate transfer mechanism 3 to be transferred to the exposure apparatus 2. When unloading of the substrate is complete, the resist coating apparatus 1 transmits a substrate unload completion notification to the exposure apparatus 2 (step S209), and the sequence in the resist coating apparatus 1 does not receive the substrate load request (NO in step S207), it stands by until it receives the substrate load request (step S207).

As described above, the resist coating apparatus 1 not only can execute resist processing in accordance with the exposure control instruction 40 sent from the host computer 8, but can send the exposure control instruction 40, and the like, for causing the exposure apparatus 2 to operate to the exposure apparatus 2.

The processing sequence in the exposure apparatus 2 will further be described mainly with reference to FIG. 3C.

The exposure apparatus 2 determines whether it receives the parameters necessary for exposure processing and exposure preparation start instruction 40-1, which have been transmitted from the resist coating apparatus 1 in step S202 of FIG. 3B (step S301). If the exposure apparatus 2 receives the parameters necessary for exposure processing and exposure preparation start instruction 40-1 (YES in step S301), the exposure apparatus 2 transmits a receipt completion notification to the resist coating apparatus 1, and at the same time, starts exposure preparation, such as movement of a mask for use in exposure processing (step S302). If the exposure apparatus 2 does not receive the parameters necessary for exposure processing and exposure preparation start instruction 40-1 (NO in step S301), it stands by until it receives the parameters necessary for exposure processing and exposure preparation start instruction 40-1 (step S301).

Then, the exposure apparatus 2 determines whether it receives the exposure process start instruction 40-4 from the resist coating apparatus 1 (step S303). If the exposure apparatus 2 receives the exposure process start instruction 40-4 from the resist coating apparatus 1 (YES in step S303), it transmits a substrate load request to the resist coating apparatus 1 when exposure preparation is complete (step S304). If the exposure apparatus 2 does not receive the exposure process start instruction 40-4 (NO in step S303), it stands by until it receives the exposure process start instruction 40-4 (step S303).

On the other hand, when transfer of the substrate to the exposure apparatus 2 is complete, the resist coating apparatus 1 transmits a substrate load completion notification to the exposure apparatus 2 (see step S209 in FIG. 3B). The exposure apparatus 2 determines whether it receives the substrate load completion notification from the resist coating apparatus 1 (step S305). If the exposure apparatus 2 receives the substrate load completion notification from the resist coating apparatus 1 (YES in step S305), it starts exposure processing for the loaded substrate (step S306). If the exposure apparatus 2 does not receive the substrate load completion notification (NO in step S305), it stands by until it receives the substrate load completion notification (step S305).

Then, the exposure apparatus 2 determines whether the exposure processing for the loaded substrate is complete (step S307). If the exposure apparatus 2 completes the exposure processing for the loaded substrate (YES in step S307), it generates control data on the basis of the exposure processing result (step S308) and transmits this control data to the development apparatus 5 through the communication line 7 connecting the exposure apparatus 2 to the development apparatus 5 (step S309). If the exposure apparatus 2 does not complete the exposure processing for the loaded substrate (NO in step S307), it stands by until the exposure processing is complete (step S307).

After exposure processing, the substrate having undergone the exposure processing is transferred from the exposure apparatus 2 to the development apparatus 5 using the substrate transfer mechanism 6. If the exposure processing is normally performed, the substrate then undergoes development processing in the development apparatus 5. If the exposure processing is not normally performed, development processing is stopped to collect the substrate.

As described above, the use of the communication line 4 between the exposure apparatus 2 and the pre-process apparatus 1 enables the pre-process apparatus 1 to control the exposure apparatus 2 in accordance with instructions from the host computer 8 or the user. At the same time, the use of the communication line 7 between the exposure apparatus 2 and the post-process apparatus 5 enables direct transmission of control data generated on the basis of the processing result of the exposure processing from the exposure apparatus 2 to the post-process apparatus 5. This allows the exposure apparatus 2 to receive the exposure control instruction 40 necessary for exposure processing of a substrate, such as the exposure preparation start instruction 40-1, exposure preparation stop instruction 40-2, exposure process standby instruction 40-3, exposure process start instruction 40-4, exposure process stop instruction 40-5, and the like, from the substrate pre-process apparatus 1 instead of the host computer 8 or the user. In addition, the exposure control instruction 40, which is input from the host computer 8 to generate control data of the post-process apparatus 5 on the basis of the processing result of the exposure processing, enables automatic control of the post-process apparatus 5. Therefore, a reduction in development cost of the host computer 8 and in load of device control on the user can be achieved.

In this embodiment, a telecommunication line is employed as a communication line, but the present invention is not limited to this. For example, an optical communication line may be used. Additionally, in this embodiment, the host computer 8 controls the resist coating apparatus 1 and exposure apparatus 2. However, the user can directly control the resist coating apparatus 1 and exposure apparatus 2.

Moreover, in this embodiment, a plurality of exposure control instructions 40 may be enqueued, and exposure processing may sequentially be performed in accordance with the plurality of enqueued exposure control instructions 40.

(Other Embodiment)

A semiconductor device manufacturing process using the above-described lithography system will be explained next.

Figure 4:
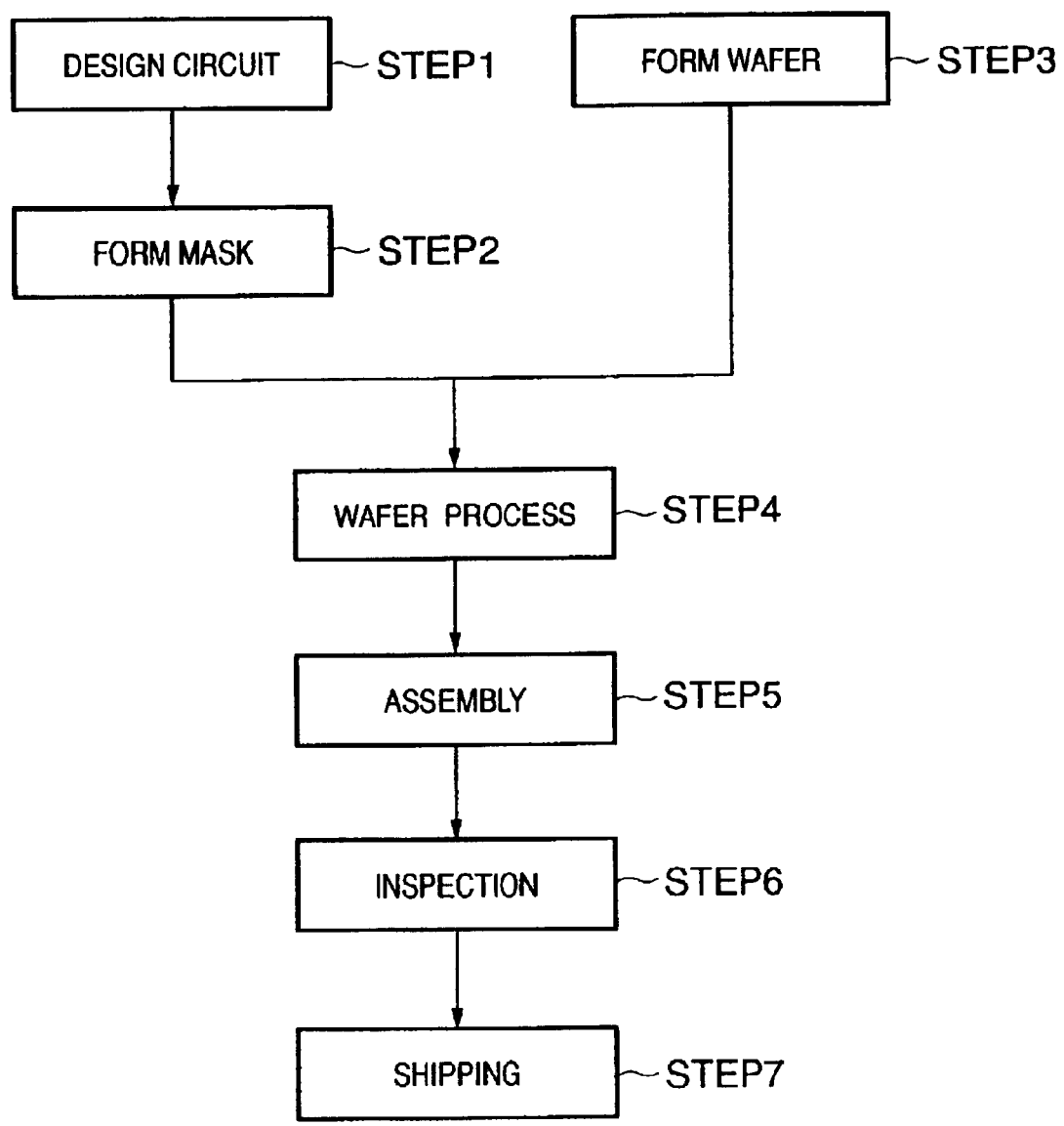
FIG. 4 is a flow chart showing the flow of the overall manufacturing process of a semiconductor device.

FIG. 4 shows the flow of the whole manufacturing process of the semiconductor device. In step 1 (circuit design), a semiconductor device circuit is designed. In step 2 (mask formation), a mask having the designed circuit pattern is formed. In step 3 (substrate formation), a substrate is formed by using a material such as silicon. In step 4 (substrate process), called a pre-process, an actual circuit is formed on the substrate by lithography using the prepared mask and substrate. Step 5 (assembly), called a post-process, is the step of forming a semiconductor chip by using the substrate formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 5:
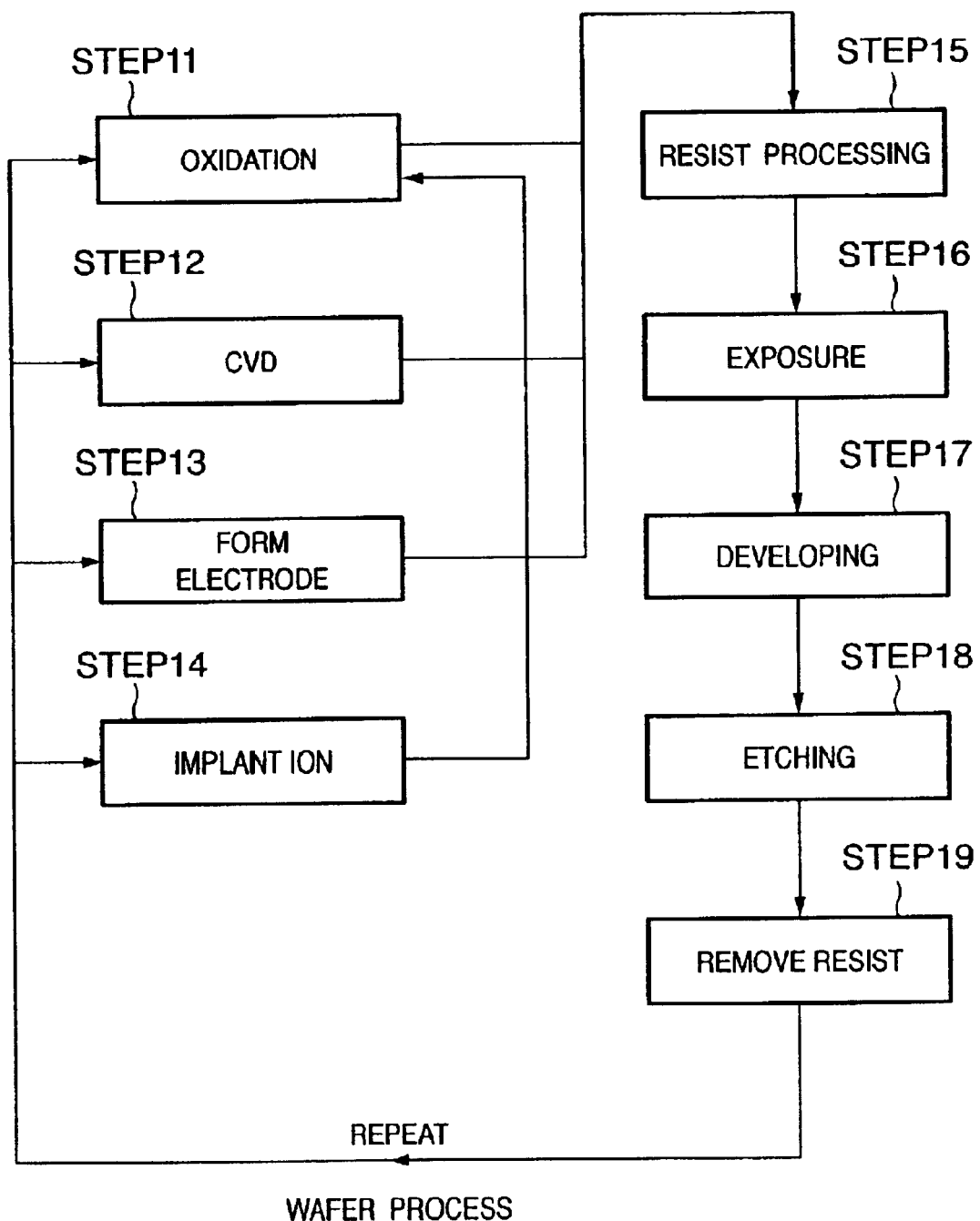
FIG. 5 is a flow chart showing the detailed flow of the substrate process in FIG. 4.

FIG. 5 shows the detailed flow of the substrate process. In step 11 (oxidation), the substrate surface is oxidized. In step 12 (CVD), an insulating film is formed on the substrate surface. In step 13 (electrode formation), an electrode is formed on the substrate by vapor deposition. In step 14 (ion implantation), ions are implanted in the substrate. In step 15 (resist processing), a photosensitive agent is applied to the substrate in accordance with an exposure control instruction 40 transmitted to a resist coating apparatus 1 by a host computer 8. The resist coating apparatus 1 extracts parameters necessary for exposure processing from the received exposure control instruction 40 and transmits them together with an exposure preparation start instruction 40-1 to an exposure apparatus 2. In step 16 (exposure), the above-mentioned exposure apparatus 2 exposes the substrate to the circuit pattern of a mask, and prints the circuit pattern on the substrate in accordance with the exposure control instruction 40 and the parameters that pertain to exposure processing, which have been received from the resist coating apparatus 1. The exposure apparatus 2 generates control data for controlling a development apparatus 5 on the basis of the exposure processing result and transmits it to the development apparatus 5. In step 17 (developing), the development apparatus 5 develops the wafer, which has been exposed on the basis of the control data transmitted from the exposure apparatus 2. In step 18 (etching), the resist is etched except for the developed resist image. In step 19 (resist removal), an unnecessary resist after etching is removed. These steps are repeated to form multiple circuit patterns on the substrate.

As has been described above, according to the present invention, e.g., a lithography system capable of reducing the load on the user in exposure processing, an exposure apparatus, and their control method, and a device manufacturing method, can be provided.

As many apparently widely different embodiments of the present invention can be made without departing from the spirit and scope thereof, it is to be understood that the invention is not limited to the specific embodiments thereof except as defined in the appended claims.

What is claimed is:

1. A lithography system comprising:
    a pre-process apparatus which performs a pre-process for a substrate; and
    an exposure apparatus which exposes the substrate pre-processed by said pre-process apparatus to a pattern,
    wherein said pre-process apparatus comprises a first control unit which receives an instruction for starting exposure preparation from a host computer and transmits the instruction to said exposure apparatus, and
    said exposure apparatus comprises a second control unit which receives the instruction transmitted from said pre-process apparatus and causes exposure preparation to start in accordance with the received instruction.

2. A system according to claim 1, wherein said first control unit further transmits at least one of an instruction for stopping exposure preparation, an instruction for making exposure processing stand by, an instruction for starting exposure processing, and an instruction for stopping exposure processing.

3. A system according to claim 1, further comprising a post-process apparatus which performs a post-process for the substrate exposed by said exposure apparatus, wherein said second control unit further transmits control data for said post-process apparatus to said post-process apparatus.

4. A system according to claim 3, wherein said post-process apparatus includes a development apparatus which performs development processing for the substrate after exposure.

5. A system according to claim 1, wherein said pre-process apparatus includes a resist coating apparatus which coats the substrate with a resist.

6. A device manufacturing method comprising:
    a step of performing a lithographic process for a substrate using a lithography system as recited in claim 1.

7. An exposure apparatus for exposing a substrate pre-processed by a pre-process apparatus to a pattern, said apparatus comprising:
    first means for receiving an instruction for starting exposure preparation transmitted by a host computer via the pre-process apparatus, and
    second means for causing exposure preparation to start in accordance with the instruction received by said first means.

8. An apparatus according to claim 7, wherein said first means further receives at least one of an instruction for stopping exposure preparation, an instruction for making exposure processing stand by, an instruction for starting exposure processing, and an instruction for stopping exposure processing.

9. An apparatus according to claim 7, further comprising means for transmitting control data for a post-process apparatus which performs a post-process for the substrate exposed by said exposure apparatus to the post-process apparatus.

10. An apparatus according to claim 9, wherein the post-process apparatus includes a development apparatus which performs development processing for the substrate after exposure.

11. An apparatus according to claim 7, wherein the pre-process apparatus includes a resist coating apparatus which coats the substrate with a resist.

12. A device manufacturing method comprising steps of:
    exposing a substrate to a pattern using an exposure apparatus as recited in claim 7; and
    developing the exposed substrate.

13. A method adapted to a lithography system comprising a pre-process apparatus which performs a pre-process for a substrate and an exposure apparatus which exposes the substrate pre-processed by the pre-process apparatus to a pattern, said method comprising steps of:
    receiving, by the pre-process apparatus, an instruction for starting exposure preparation from a host computer;

transmitting, by the pre-process apparatus, the instruction to the exposure apparatus; and causing, by the exposure apparatus, exposure preparation to start in accordance with the instruction transmitted in said transmitting step.

14. A method adapted to an exposure apparatus for exposing a substrate pre-processed by a pre-process apparatus to a pattern, said method comprising steps of:

receiving an instruction for starting exposure preparation transmitted by a host computer via the pre-process apparatus; and causing exposure preparation to start in accordance with the instruction received in said receiving step.

15. A device manufacturing method comprising steps of:

transmitting, by a host computer, an instruction for starting exposure preparation to a pre-process apparatus which performs a pre-process for a substrate;

transmitting, by the pre-process apparatus, the instruction transmitted from the host computer to an exposure apparatus which exposes the substrate pre-processed by the pre-process apparatus to a pattern; and causing, by the exposure apparatus, exposure preparation to start in accordance with the instruction transmitted from the pre-process apparatus.

* * * * *